(12) United States Patent
Chen et al.

(10) Patent No.: US 9,812,359 B2
(45) Date of Patent: Nov. 7, 2017

(54) THRU-SILICON-VIA STRUCTURES

(71) Applicant: INTERNATIONAL BUSINESS MACHINES CORPORATION, Armonk, NY (US)

(72) Inventors: Fen Chen, Williston, VT (US); Mukta G. Farooq, Hopewell Junction, NY (US); Carole D. Graas, Jericho, VT (US); Xiao Hu Liu, Briarcliff Manor, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/733,445

(22) Filed: Jun. 8, 2015

(65) Prior Publication Data

US 2016/0358821 A1   Dec. 8, 2016

(51) Int. Cl.
  *H01L 21/768*   (2006.01)
  *H01L 23/48*   (2006.01)

(52) U.S. Cl.
  CPC ...... *H01L 21/76898* (2013.01); *H01L 23/481* (2013.01); *H01L 21/7682* (2013.01); *H01L 21/76831* (2013.01)

(58) Field of Classification Search
  CPC ......... H01L 21/76898; H01L 21/02118; H01L 23/481; H01L 21/76831; H01L 21/7682; H01L 23/53238; H01L 21/76846; H01L 21/76879; H01L 21/288; H01L 21/02271; H01L 21/7684
  See application file for complete search history.

(56) References Cited

U.S. PATENT DOCUMENTS

| | | | |
|---|---|---|---|
| 6,045,666 A * | 4/2000 | Satitpunwaycha | . C23C 14/0036 204/192.12 |
| 7,964,502 B2 | 6/2011 | Dao et al. | |
| 8,178,950 B2 | 5/2012 | Dao et al. | |
| 8,242,604 B2 | 8/2012 | Volant et al. | |
| 8,394,715 B2 | 3/2013 | Volant et al. | |
| 8,816,505 B2 | 8/2014 | Mohammed et al. | |
| 9,165,883 B2 * | 10/2015 | Vannier | ............. H01L 21/76802 |
| 2005/0121768 A1 | 6/2005 | Edelstein et al. | |
| 2006/0001174 A1 | 1/2006 | Matsui | |
| 2010/0193954 A1 * | 8/2010 | Liu | ................... H01L 21/76898 257/751 |

(Continued)

OTHER PUBLICATIONS

Merritt, "GloFo Shows Progress in 3D Stacks", EE Tomes, Mar. 19, 2014, 3 pages.

*Primary Examiner* — Marc Armand
*Assistant Examiner* — Sue Tang
(74) *Attorney, Agent, or Firm* — Anthony Canale; Andrew M. Calderon; Roberts Mlotkowski Safran Cole & Calderon P.C.

(57) ABSTRACT

Stress generation free thru-silicon-via structures with improved performance and reliability and methods of manufacture are provided. The method includes forming a first conductive diffusion barrier liner on an insulator layer within a thru-silicon-via of a wafer material. The method further includes forming a stress absorption layer on the first conductive diffusion barrier. The method further includes forming a second conductive diffusion barrier on the stress absorption layer. The method further includes forming a copper plate on the second conductive diffusion barrier.

4 Claims, 3 Drawing Sheets

(56) References Cited

U.S. PATENT DOCUMENTS

| | | | |
|---|---|---|---|
| 2010/0323202 A1* | 12/2010 | Burckhardt | C08G 18/10 |
| | | | 428/423.1 |
| 2014/0264911 A1* | 9/2014 | Lin | H01L 23/481 |
| | | | 257/774 |
| 2014/0302674 A1* | 10/2014 | Ramachandran | H01L 21/76898 |
| | | | 438/667 |

* cited by examiner

THRU-SILICON-VIA STRUCTURES

FIELD OF THE INVENTION

The invention relates to semiconductor structures and, more particularly, to stress generation free thru-silicon-via structures with improved performance and reliability and methods of manufacture.

BACKGROUND

Thru-silicon-vias (TSV) are an important feature for stacking of chips. TSVs are formed by etching a via into a substrate, lining the via with an insulator material and a diffusion barrier layer, and then filling the remaining portion of the via with a copper material. Copper (Cu) filling, though, happens at high temperature, and upon cooling, Cu shrinks more than substrate (Si) due to its higher coefficient of thermal expansion (CTE), e.g., about 5× higher than Si.

This CTE mismatch leads to normal tension in silicon around the TSV while tangential compression in silicon due to silicon crowding around the TSV. Such tension and compression stress negatively impacts nearby device performance and reliability. The degree of such stress impact is known to have a dependence on TSV metallic liner thickness; that is, the thicker the liner, the worse the stress impact becomes. On the other hand, TSV insulation reliability is important, and a thicker metallic liner provides a better barrier function for Cu diffusion out of the TSV.

SUMMARY

In an aspect of the invention, a method comprises forming a first conductive diffusion barrier liner on an insulator layer within a thru-silicon-via of a wafer material. The method further comprises forming a stress absorption layer on the first conductive diffusion barrier. The method further comprises forming a second conductive diffusion barrier on the stress absorption layer. The method further comprises forming a copper plate on the second conductive diffusion barrier.

In an aspect of the invention, a method comprises: forming a thru-silicon-via in a wafer; lining the thru-silicon-via with an insulator material; lining the insulator material with a diffusion barrier liner; forming a stress absorption insulator layer on the diffusion barrier liner having a Young's modulus of about 10 GPa or less; lining the stress absorption insulator layer with a second diffusion barrier liner; forming a copper plate on the second diffusion barrier liner; planarizing a surface of the wafer by removing the insulator material, diffusion barrier liner, stress absorption insulator layer, second diffusion barrier liner and copper plate from a surface of wafer which was deposited therein during the lining and forming steps; and forming a capping material on the planarized surface.

In an aspect of the invention a structure comprises: a thru-silicon-via in a wafer; an insulator material lining the thru-silicon-via; a floating diffusion barrier liner lining the insulator material; a stress absorption insulator layer on the diffusion barrier liner having a Young's modulus of about 10 GPa or less; a diffusion barrier liner lining the stress absorption insulator layer; a copper plate on the second diffusion barrier liner; and a capping material on a planarized surface wafer and covering the insulator material, floating diffusion barrier liner, stress absorption insulator layer, diffusion barrier liner, and copper plate.

BRIEF DESCRIPTION OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and, more particularly, to stress generation free thru-silicon-via (TSV) structures with improved performance and reliability and methods of manufacture. In embodiments, the stress generation free thru-silicon-via structures include multiple liners which reduces stress on a thinned wafer which result from process temperature variations and CTE mismatches of material. In more specific embodiments, the TSV structures include a double metallic liner with an insulator material therebetween for improved TSV reliability. In embodiments, the insulator layer is a stress absorption layer, while the double metallic liners improve Cu diffusion barrier functionality. The use of two metallic liners is counterintuitive as it is known that metallic liner thickness significantly increases stress impact on the structure.

More specifically, the present invention relates to a TSV structure comprising a stress absorption layer (e.g., very low modulus such as SiLK, polymer, ULK, etc.) formed between two metallic liners of the TSV. Further, the TSV structure also comprises double metallic liners to improve Cu diffusion barrier functionality, wherein the second metallic liner will be floating all the time during operation to provide an extra protection for Cu diffusion plus allowing a second intrinsic TSV dielectric liner breakdown to provide an extra improvement of dielectric reliability.

The TSV structures of the present invention can be manufactured in a number of ways using a number of different tools. In general, though, the methodologies and tools are used to form structures with dimensions in the micrometer and nanometer scale. The methodologies, i.e., technologies, employed to manufacture the TSV structures of the present invention have been adopted from integrated circuit (IC) technology. For example, the TSV structures of the present invention are built on wafers and are realized in films of material patterned by photolithographic processes on the top of a wafer. In particular, the fabrication of the TSV structures of the present invention uses three basic building blocks: (i) deposition of thin films of material on a substrate, (ii) applying a patterned mask on top of the films by photolithographic imaging, and (iii) etching the films selectively to the mask.

Figure 1:
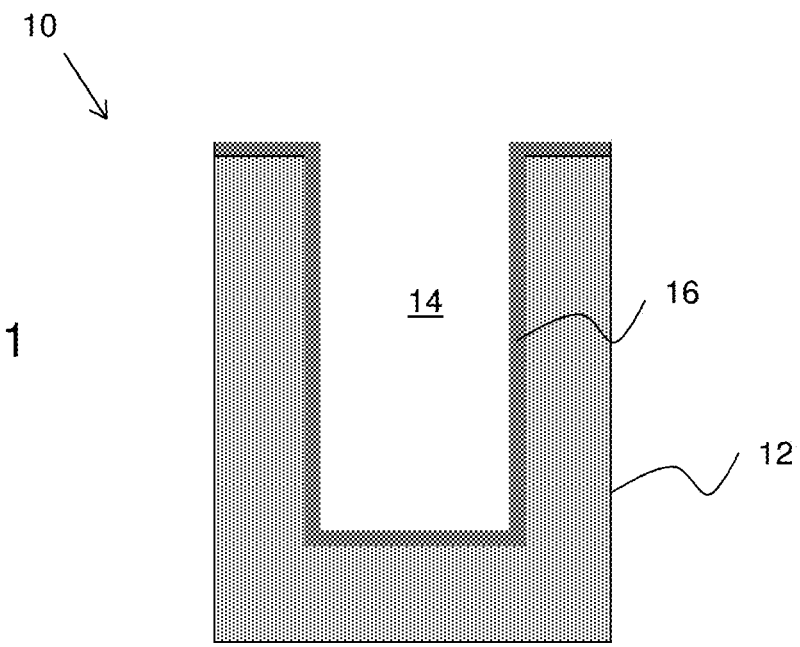
FIGS. 1-5 show fabrication processes for forming a thru-silicon-via and respective structures in accordance with aspects of the invention.

FIG. 1 shows a structure and respective processes in accordance with aspects of the invention. More specifically, FIG. 1 shows a structure 10 comprising a wafer 12. In embodiments, the wafer 12 can be composed of any suitable material including, but not limited to, Si, SiGe, SiGeC, SiC, GE alloys, GaAs, InAs, InP, and other III/V or II/VI compound semiconductors. The wafer 12 can also be silicon on insulator (SOI) or bulk wafer.

In embodiments, a thru-silicon-via (TSV) 14 is formed in the wafer 12 using conventional lithographic and etching processes. In embodiments, the via is a TSV, which can extend entirely through a thickness of the wafer 12. In embodiments, the via 14 can be initially formed partially through the wafer, with subsequent thinning of the wafer through a grinding process to form the TSV. In any scenario, to form the via 14, a resist can be formed on the surface of the wafer 12 which is exposed to energy (light) to form a pattern (openings). The wafer 12 then undergoes an etching process through the openings to form vias 14. The etching process can be a conventional reactive ion etching (RIE), as an example. The resist can then be stripped using conventional stripping processes, e.g., oxygen ashing.

Still referring to FIG. 1, a liner 16 is deposited in the via 14. In embodiments, the liner 16 can be an oxide material (e.g., $SiO_2$) or other insulator layer, deposited using chemical vapor deposition (CVD) processes. In further embodiments, the liner 16 can be deposited as a high aspect ratio dielectric using sub-atmospheric-pressure CVD (SACVD) or plasma enhanced CVD (PECVD) processes. In embodiments, the liner 16 can be deposited to a thickness of about 1 micron, although other dimensions are contemplated by the present invention.

Figure 2:
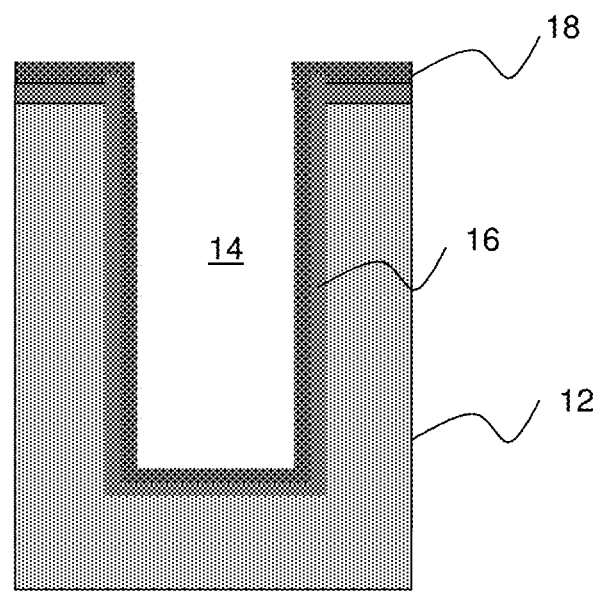

In FIG. 2, a conductive material 18, e.g., diffusion barrier liner, is deposited on the insulator liner 16. In embodiments, the conductive material 18 can be any conductive metal or metal alloy. For example, the liner 18 can be a metallic liner such as Ta or TaN. In embodiments, the liner 18 will be floating during operation to provide an extra protection for Cu diffusion and to provide an extra improvement of dielectric reliability. As the liner 18 will be floating, it will be electrically isolated from both the wafer 12 and any subsequent conductive material formed in the via 14. In embodiments, the liner 18 can be deposited using CVD processes or other deposition processes, e.g., atomic layer deposition (ALD), etc. In embodiments, the liner 18 can be deposited to a thickness of about 0.1 microns, although other dimensions are contemplated by the present invention.

Figure 3:
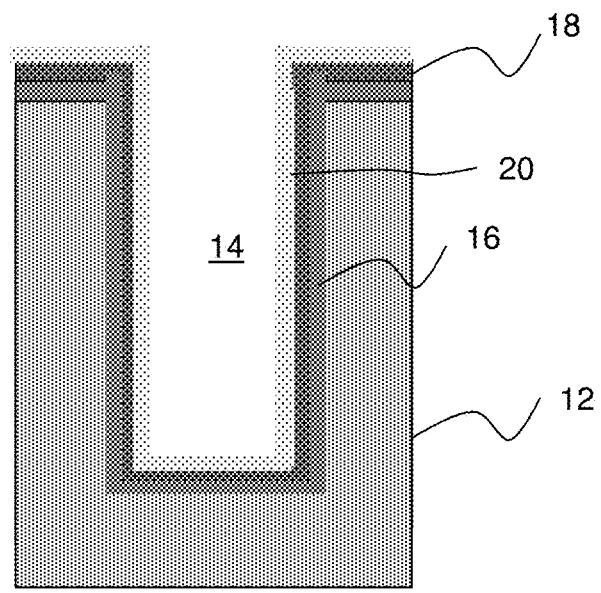

As shown in FIG. 3, a stress absorption layer 20 is deposited on the liner 18. In embodiments, the stress absorption layer 20 is composed of a material with very low Young's modulus such as SiLK, polymer, ultra-low K dielectrics (ULK), etc. In embodiments, the Young's modulus of the stress absorption layer 20 is less than about 10 GPa, with preferably a Young's modulus of about 1.1 GPa to about 1.8 GPa. In embodiments, the stress absorption layer 20 can also be a combination of materials, including, e.g., a thermally degradable polymer material which will act as sacrificial dielectric liner at the top portion of via 14 to form air cavities as further described herein. In embodiments, the stress absorption layer 20 can be deposited using a conventional CVD process to a thickness of about 0.3 microns, although other dimensions are contemplated by the present invention. The stress absorption layer 20 also has the advantage of providing a second insulator material, allowing a second intrinsic TSV dielectric liner breakdown.

Figure 4:
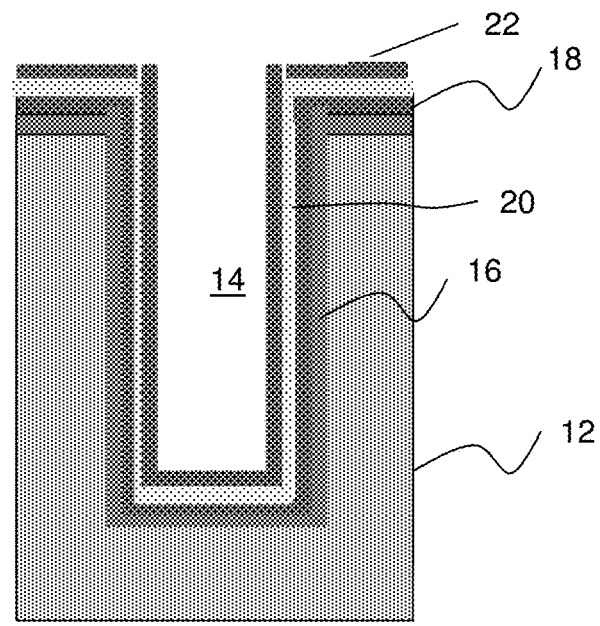

In FIG. 4, a conductive material 22, e.g., diffusion barrier liner, is deposited on the stress absorption layer 20. In embodiments, the conductive material 22 can be any conductive metal or metal alloy. For example, the liner 22 can be a metallic liner such as Ta or TaN. In embodiments, the liner 22 will effectively double the thickness of the liner in the via 14, while still minimizing the stress impact on the TSV structure. By using two layers of conductive material, e.g., diffusion barrier liner, it is now possible to provide an extra protection for Cu diffusion. In embodiments, the liner 22 can be deposited using CVD processes or other deposition processes, e.g., atomic layer deposition (ALD), etc. In embodiments, the liner 22 can be deposited to a thickness of about 0.1 microns, although other dimensions are contemplated by the present invention.

Figure 5:
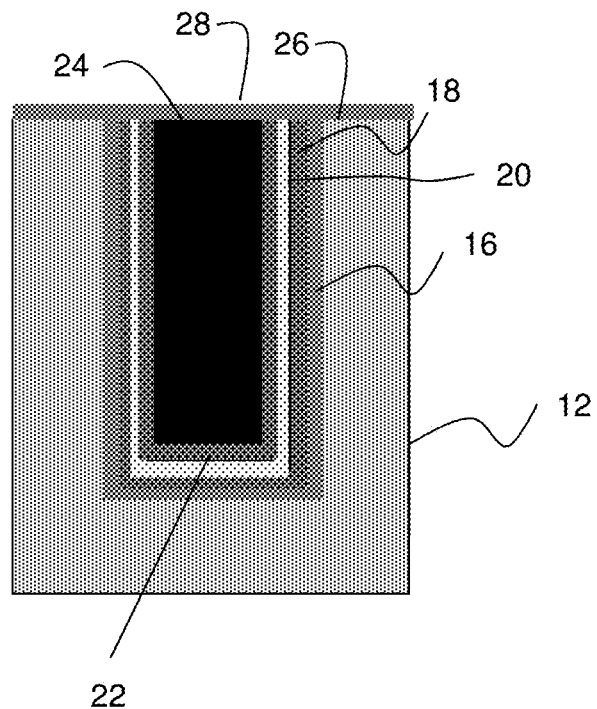

In FIG. 5, a conductive plate 24 is formed on the conductive material 22, e.g., diffusion barrier liner, in the via 14. In embodiments, the conductive plate 24 can be any conductive metal or metal alloy, with a preference for copper. In embodiments, the conductive plate 24 can be deposited using a copper seed layer followed by a copper electroplating process. Any material, e.g., materials 16, 18, 20, 22, and 24, deposited on the surface of the wafer 12 can then be removed by a mechanical chemical planarization (CMP) process to form a planarized surface 26. In embodiments, the liners 18 and 22 will effectively prevent copper diffusion of the conductive plate 24 due to the double thickness of the metal layers, e.g., diffusion barrier layers.

An optional liner 28 can be deposited on the surface of the wafer 12 and planarized surfaces of the materials 16, 18, 20, 22, and 24. In embodiments, the liner 28 can be a SiN or SiCN dielectric cap layer deposited to a thickness of about 1000 Å, although other dimensions are contemplated by the invention.

Figure 6:
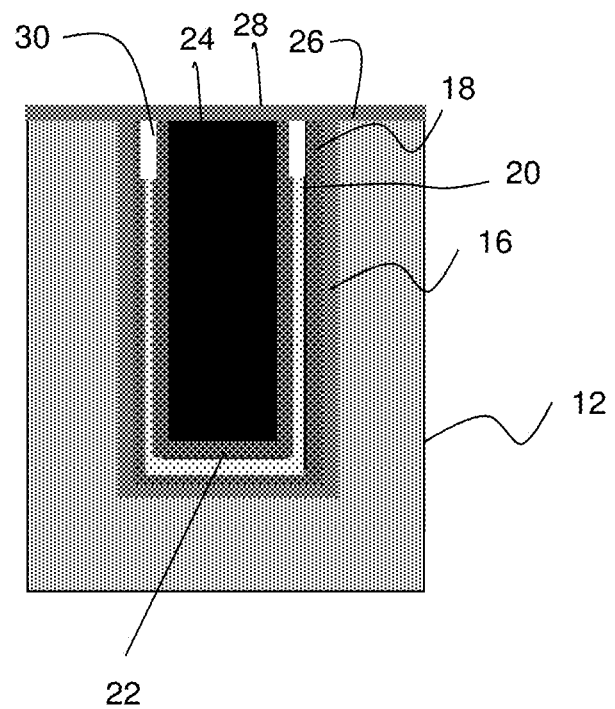
FIG. 6 shows an alternative thru-silicon-via and respective processing in accordance with aspects of the invention.

FIG. 6 shows an alternative thru-silicon-via and respective processing in accordance with aspects of the invention. More specifically, the structure 10' includes an airgap 30 that is formed by removal of a top portion of the stress absorption layer 20. In embodiments, the airgap 30 can be formed by a selective dry etching process to remove a portion of the stress absorption layer 20. In embodiments, the airgap will increase the stress absorption properties of the structure due to the fact that air has a Young's modulus of 1.0.

In alternative embodiments, the stress absorption layer 20 can be a thermally degradable polymer material used as a sacrificial dielectric liner at the top portion of via 24 to form air cavities. In embodiments, the thermal degradable polymer is decomposed by heat (optionally in combination with UV) through a SiN or SiCN dielectric cap layer 28. In alternative embodiments, the sacrificial layer might also be removed by selective (wet or dry) etching through the SiN or SiCN dielectric cap layer 28.

Accordingly, the structures shown and described herein provide many advantages. For example, the structures address the metallic liner problem by effectively doubling the liner thickness while still minimizing the stress impact from thicker liner to the wafer 12. Also, the structures it naturally improve TSV dielectric liner reliability breakdown by including two separate liners. In addition, the stress absorption layer can absorb mechanical stress induced by the floating liner and the copper plat, in addition to any other CTE mismatches between materials. Moreover, even if the stress absorbing layer is damaged due to stress, the additional oxide layer 16 will still provide the desired protection. Accordingly, from a dielectric liner breakdown point of view, the structures can tolerate two successive breakdowns. In addition, with the second floating liner 18, applied voltage is actually divided between the stress absorption layer 20 and the insulator liner 16. Lastly, and as an added bonus, the structures of the present invention provide two serial connected (stacked) capacitors: (i) the wafer 12, insulator liner 16 and floating liner 18 and (ii) the plate 24 and liner 22, stress absorption layer 20 and the floating liner 18.

The structure(s) and processes as described above are used in integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:
1. A structure comprising:
   a thru-silicon-via in a wafer;
   an insulator material lining the thru-silicon-via;
   a floating diffusion barrier liner lining the insulator material;
   a stress absorption layer on the floating diffusion barrier liner;
   a diffusion barrier liner lining the stress absorption insulator layer;
   a copper plate on the diffusion barrier liner; and
   a capping material on a planarized surface of wafer and covering the insulator material, floating diffusion barrier liner, stress absorption insulator layer, diffusion barrier liner, and copper plate,
   wherein the floating diffusion barrier liner is Ta or TaN,
   wherein the insulator material completely lines a sidewall of the thru-silicon-via,
   wherein the floating diffusion barrier liner is in direct contact and completely lines the insulator material within the thru-silicon-via,
   wherein the stress absorption layer is an insulator material,
   wherein the stress absorption layer directly contacts the floating diffusion barrier liner, and
   wherein the diffusion barrier liner is directly contacting the stress absorption insulator layer.
2. The structure of claim 1, further comprising an airgap in the thru-silicon-via.
3. The structure of claim 2, wherein the airgap is between a top portion of the stress absorption layer, the capping material and the floating diffusion barrier liner.
4. The structure of claim 3, wherein the capping material is SiN or SiCN.

* * * * *